United States Patent [19]
Rodder

[11] Patent Number: 5,475,266
[45] Date of Patent: Dec. 12, 1995

[54] STRUCTURE FOR MICROELECTRONIC DEVICE INCORPORATING LOW RESISTIVITY STRAPS BETWEEN CONDUCTIVE REGIONS

[75] Inventor: Mark S. Rodder, University Park, Tex.

[73] Assignee: Texas Instruments Incorporated

[21] Appl. No.: 342,400

[22] Filed: Nov. 18, 1994

Related U.S. Application Data

[63] Continuation of Ser. No. 149,147, Nov. 5, 1993, abandoned, which is a continuation of Ser. No. 840,379, Feb. 24, 1992, abandoned.

[51] Int. Cl.⁶ .................................................. H01L 23/48
[52] U.S. Cl. ..................... 257/750; 257/751; 257/757; 257/764; 257/767; 257/770; 257/774; 257/635
[58] Field of Search ............................... 257/750, 751, 257/757, 764, 767, 770, 774, 635

[56] References Cited

U.S. PATENT DOCUMENTS

| | | | |
|---|---|---|---|
| 4,866,009 | 9/1989 | Matsuda | 437/203 |
| 4,874,719 | 10/1989 | Kurosawa | 437/195 |
| 4,884,123 | 11/1989 | Dixit et al. | 257/774 |
| 5,079,617 | 1/1992 | Yoneda | 257/755 |

*Primary Examiner*—Edward Wojciechowicz
*Attorney, Agent, or Firm*—Brian C. McCormack; James C. Kesterson; Richard L. Donaldson

[57] ABSTRACT

A microelectronic device (10) provides decreased use of bar area to form contacts between a conductive strap (24) or interconnect and subsequent levels. The conductive strap comprises a conducting layer (130) and an overlying semiconducting layer (132). Connection to subsequent levels is made generally overlying substrate conductive areas such as a gate (14) and/or a moat (16). Connection to conductive sublayer (130) is accomplished by doping an overlying semiconductor sublayer (132). Any counter-doping of substrate conductive areas is blocked by an overlying well of dopant-masking (33) or sufficiently thick semiconducting (32) material.

21 Claims, 3 Drawing Sheets

STRUCTURE FOR MICROELECTRONIC DEVICE INCORPORATING LOW RESISTIVITY STRAPS BETWEEN CONDUCTIVE REGIONS

This application is a continuation of application Ser. No. 08/149,147 filed Nov. 5, 1993 now abandoned; which is a continuation of application Ser. No. 07/840,379 filed Feb. 24, 1992 now abandoned.

BACKGROUND OF THE INVENTION

This invention relates to microelectronic devices incorporating conductive, connecting straps. More particularly, it is concerned with the method and structure for forming such a device incorporating low-resistivity straps between conductive regions.

The growing use of silicides (e.g. titanium silicide) in microelectronic devices is well known. Silicides, among other uses, are used to diminish contact resistivity for conductor regions such as at moats and gates. Silicides are also used for the formation of local interconnects or straps to reduce sheet resistivity in the interconnect. One method of using silicides simultaneously for these types of applications is to lay down a blanket of titanium (or other silicide-forming metal) followed by a blanket of less conductive material, for example noncrystalline silicon. The noncrystalline silicon and titanium is then patterned so that it remains only where the straps are to be formed. Then the titanium is reacted with the overlying noncrystalline silicon to form titanium silicide. Titanium also reacts with underlying polysilicon and silicon at various sites, not only where local interconnects are formed but at other sites.

To make subsequent contact to other circuit elements (e.g. poly-silicon or poly-Si conductors, poly-Si drain/source regions, poly-Si resistors, metal level conductors), typically the noncrystalline silicon contains dopant which forms an electrical connection from the top surface of the noncrystalline silicon to the underlying titanium silicide. One method of making said subsequent contacts is to deposit doped noncrystalline silicon as the layer reacted with and overlying the titanium silicide.

Another method is to overlay the titanium with an undoped noncrystalline or polycrystalline layer, and selectively dope the areas where a connection is desired.

One problem that has been found with the technique of forming straps and silicided moats and gates simultaneously is that such a method constrains the initial titanium deposition to be a certain minimum thickness in order to achieve acceptable silicide sheet resistivity at moats, gates, and any other site where the silicide is to be formed. Another problem is that since titanium is blanket deposited for simultaneous creation of contacts and straps, one area of the device cannot be silicide-connected to another if an unrelated, exposed conductor is interposed. That is to say, such an interconnect would be shorted to the interposing unrelated conductor. Another problem is that the patterned etch of the overlying noncrystalline silicon must substantially stop on the underlying titanium to maintain a desired titanium thickness over moat and gate regions after etch. However, the selectivity of the silicon etch to underlying titanium is not large such that substantial loss of titanium can result during the silicon etch. Additionally, for thin titanium, the silicon etch might etch through the underlying titanium and even etch into the underlying silicon moat regions. Yet another problem with this technique is that titanium necessarily reacts with underlying materials such as oxide in locations without overlying noncrystalline silicon. This reaction with other materials such as oxygen or nitride could lead to the formation of compounds not as easily removed—for example titanium oxide or titanium oxide nitride (Ti-O-N). Filaments of such undesirable compounds as titanium oxide nitride may not be easily removed and can often lead to undesirable shorting.

Another problem that has been discovered relates to connecting two or more connected conductor regions of semiconductor doped with different impurity type and making a further interlevel connection with subsequently formed circuit elements. One method of connecting the conductor regions while enabling further interlevel connections is to deposit doped noncrystalline silicon. In that instance, during subsequent processing steps, the impurities from the overlying doped deposited noncrystalline silicon can diffuse through the titanium silicide, possibly resulting in counterdoping an adjacent conductor region of opposite doping type. Another method existing in the prior art for making subsequent interlevel connection is to deposit undoped noncrystalline silicon, and subsequently mask and dope to make electrical connection from the underlying silicide to the top surface of the undoped noncrystalline silicon. If it is desired to use arbitrary or only a single-type dopant for the interlevel connections, then such connections cannot be made directly above underlying circuit elements without carrying the aforementioned counterdoping risks. Such a connection scheme requires additional, non-overlying, area be allocated for the interlevel connections. Another problem with this method is that a mask must be used to add dopants to the undoped noncrystalline silicon.

What is needed then is a method which allows for formation of silicided interconnects yet also allows the silicided interconnect to be as thin as necessary. This allows the interconnects to practically overlie unrelated conductors. Also needed is a method wherein titanium will not be reacted in such a manner as to form undesirable compounds which cannot be removed and possibly result in undesired shorting. Also needed is a method whereby the interconnect can be patterned and etched with high selectivity to underlying layers. Furthermore, a method is needed for which a silicided interconnect can be formed independently of gate and moat silicidation.

Additionally, a method is needed which allows for formation of silicided interconnections, yet also allows interlevel connections to be placed above circuit elements, without counterdoping said circuit elements and without requiring additional bar area, regardless of doping process or dopant type. In the preferred embodiment, this process is self-aligning to underlying circuit elements, and does not require any additional masking step for the doping process.

SUMMARY OF THE INVENTION

The problem outlined above is in large measure solved by the microelectronic device in accordance with the present invention. That is to say, the device hereof provides a distinct silicide formation for purposes of forming a silicided local interconnect, allows interconnects to effectively overpass unrelated conductors, provides a method to obviate undesirable nonsilicon titanium reactions during strap formation, provides a method to etch the interconnect with high selectivity to underlying layers, and allows interlevel connections to be placed above underlying circuit elements without additional masking steps.

The microelectronic device in accordance with the present invention also provides a substrate having a first conductive area and a second conductive area. A first insulating layer is selectively formed over the substrate so as not to cover predetermined portions of the first and second conductive areas, where the openings above the conductive areas have sides that are predominantly vertical. A conducting strap connects the first and second conductive areas. The conducting strap or local interconnect may include a reacted sublayer, (preferably a silicide) and may include an unreacted sublayer, preferably undoped noncrystalline silicon. The fact that the strap is silicided lowers the contact resistivity between the strap and the first and second conductive areas, respectively, and also lowers the sheet resistivity of the strap itself.

Furthermore, the device hereof provides for use of silicon to be the silicide-overlying material, while providing a generally vertical connection from the conductor region that allows subsequent dopant implantation to occur directly above this region without any risk of counterdoping. The openings above the conductive regions may either be covered by the unreacted noncrystalline silicon of sufficient depth to prevent impurities from any subsequent doping operation from penetrating into the underlying conductive region, may be covered by a second insulating layer, or may be covered by some combination of the unreacted sublayer and the second insulating layer. In the preferred embodiment, the second insulating layer serves as a self-aligned mask for subsequent doping operations. In any case the geometry of the device will serve to prevent doping impurities from reaching the conductive regions.

In preferred embodiments a silicide-forming metal is reacted with silicon to form the silicide sublayer, while the overlying silicon sublayer substantially includes undoped noncrystalline silicon. The first and second insulating layers in preferred embodiments substantially include oxide.

BRIEF DESCRIPTION OF THE DRAWINGS

Corresponding numerals and symbols in the different figures refer to corresponding parts unless otherwise indicated.

DESCRIPTION OF THE PREFERRED EMBODIMENTS

Figure 1A:
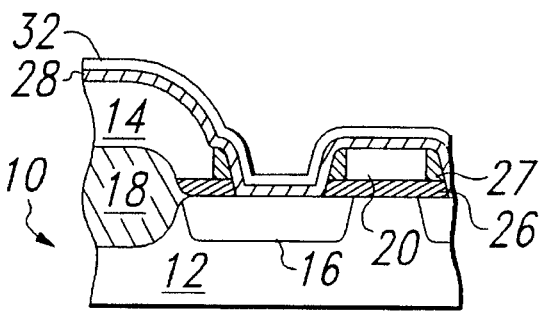
FIGS. 1a–1d, in partial cross section, illustrate progressive formation of a microelectronic device formed in accordance with the prior art.

Referring now to the drawings in general and FIG. 1a in particular, the method of manufacturing device 10 of the prior art will now be described. Substrate 12 is typically formed of a monocrystalline silicon wafer. Substrate 12 is formed so as to include a field oxide 18. Substrate 12 further includes a gate oxide 26, a doped moat 16, a doped gate 14, doped, unrelated gate 20 and sidewall oxides 27. A silicide-forming metal layer 28, for example titanium, is formed and then a noncrystalline silicon layer 32 is formed over the metal layer 28 as shown.

Figure 1B:
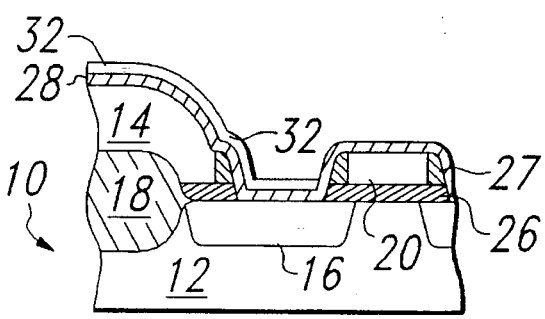

Referring to FIG. 1b, noncrystalline silicon layer 32 is then patterned and etched as shown with the etch of layer 32 substantially needing to stop on layer 28. Noncrystalline silicon layer 32 may be intrinsic or is appropriately doped for the application—either p-type or n-type in a manner well known in the art.

Figure 1C:
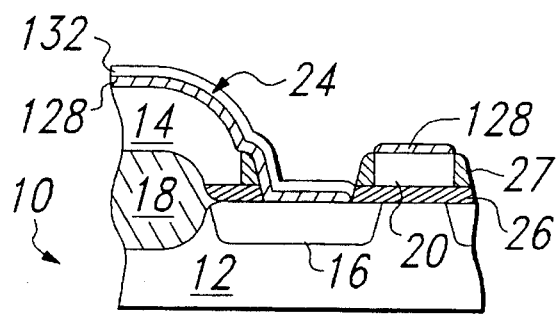

Referring to FIG. 1c, titanium layer 28 is reacted, typically by annealing, with overlying noncrystalline silicon layer 32 and underlying silicon and polysilicon to form titanium silicide sublayer 128. The structure resulting from the reaction includes strap 24 having a sublayer 132 of unconsumed noncrystalline silicon and, silicide sublayer 128. Note the formation of silicide 128 at other areas such as at the top of unrelated gate 20. It should also be noted that although titanium layer 28 is graphically depicted in a substantially similar manner as titanium silicide sublayer 128 the two are chemically and electrically different.

Figure 1D:
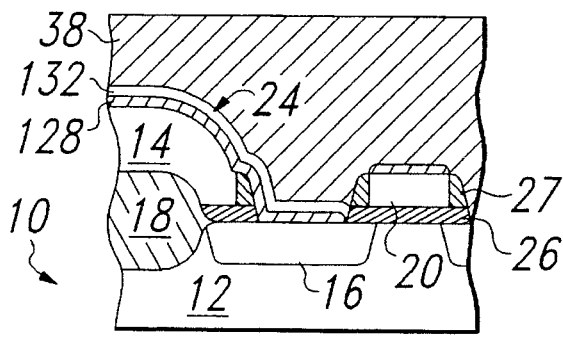

Referring to FIG. 1d, overlying insulator 38 is then formed over the resulting structure to complete microelectronic device 10. It should be noted that other aspects of device have not been shown which would require other steps well understood in the art such as formation of bonding pads, etc.

The disadvantage of the prior art device 10 will be noticed in FIG. 1b in that only noncrystalline silicon layer 32 is patterned but titanium layer 28 cannot be completely patterned. In other words the titanium must be left at sites for formation of silicide such as at unrelated gate 20. Thus in FIG. 1c it will be noted that the titanium is reacted to simultaneously silicide moat 16 and gate regions 14, 20 as well as to form strap 24 between gate 14 and moat 16.

As mentioned above, another disadvantage is the low etch selectivity between titanium and silicon. Hence, the etch required to arrive at the structure may result in damage underlying the exposed portions of titanium layer 28.

Figure 2:
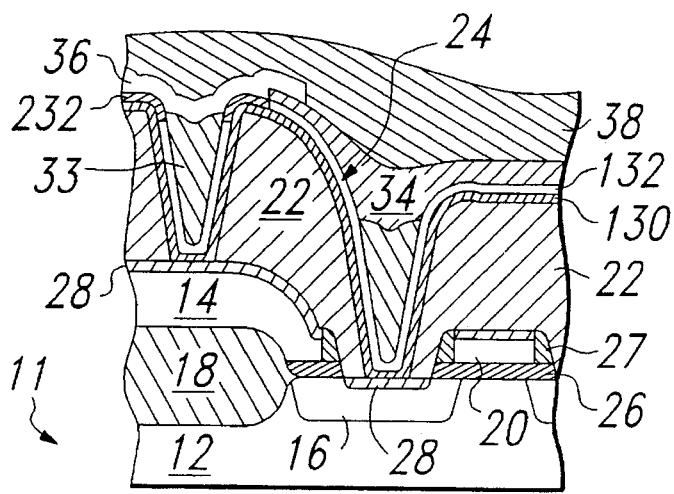
FIG. 2, in partial cross section, illustrates preferred embodiment of the present invention.

Referring now to the present invention and FIG. 2 in particular, a microelectronic device 11, incorporating low-resistivity straps between conductive regions, in accordance with the invention, is partially depicted. Device 11 includes a substrate 12 having a gate or first region 14, a moat or second region 16, a field oxide 18, and an unrelated gate 20. Device 11 further includes insulating layer or oxide 22, and a local interconnect or strap 24. Strap 24 electrically connects gate 14 to moat 16 but is not in electrical communication with unrelated gate 20. Within the inventive concept, a strap is a conductor which places two or more integrated circuit regions in electrical communication. Thus a strap can be a local interconnect but may also be any other connective conductor. Although device 11 is illustrated as an SRAM, the inventive strap could be used in any application requiring such a strap, such as in, by way of example but not limited to, an SRAM, DRAM, logic or SOI circuit. In accordance with the present invention, strap 24 provides low contact resistance to gate 14 and moat 16 respectively as well as providing low sheet resistance therebetween. Oxide 22 is formed so as to allow strap 24 to overlie unrelated gate 20 without shorting thereto. Indeed, strap 24 can be connected with other conductors at other portions of device 11 if desired in accordance with the invention. Still further, an oxide 33 is deposited to allow subsequent doping of inter-level connection directly above the integrated circuit regions without risk of counterdoping the integrated circuit regions.

Figure 3:
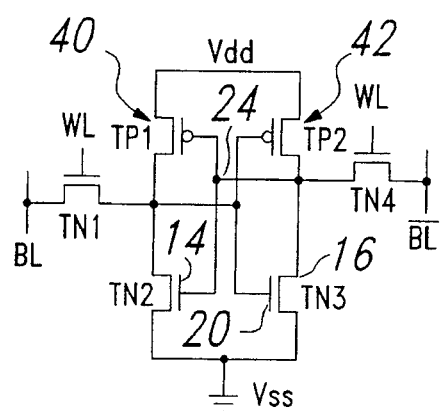
FIG. 3 schematically illustrates a 6T SRAM cell and associated circuitry incorporated in the preferred embodiment of the present invention.

Referring now to FIG. 3, comparison of FIG. 3 to FIG. 2 will help to reveal the portion of the SRAM cell structure depicted in FIG. 2. By reference to FIG. 3, moat 16 is the drain region of transistor TN3 and gate 14 is the gate region of transistor TN2. Strap 24 connects moat 16 to gate 14 and overlies but does not connect to gate region 20 of transistor TN3.

Figure 4A:
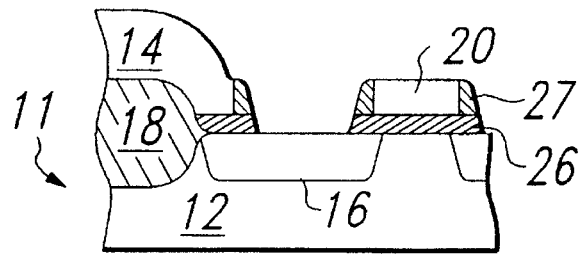
FIGS. 4a–4f, in partial cross section, illustrate progressive steps in the formation of a microelectronic device in accordance with the present invention.

Referring now to FIG. 4a, the method of forming device 11 will now be described. Substrate 12 is preferably substantially formed of a monocrystalline silicon wafer although it will readily be understood that other semiconducting materials (for example gallium arsenide or germanium) could also be used. Substrate 12 is formed so as to include field oxide 18, such formation being well known in the art. Substrate 12 further includes gate oxide 26, doped moat 16, doped gate 14, doped, unrelated gate 20 and sidewall oxides 27. The formation of the elements as depicted in FIG. 4a is well known to those skilled in the art and thus will not be described in greater detail. It should be noted that geometric configurations and proportions are not drawn to scale and should not be interpreted in any of the figures as limiting the scope of the invention.

Figure 4B:
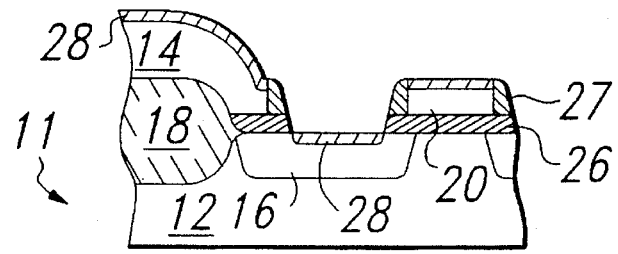

Referring to FIG. 4b, a silicide-forming metal, for example titanium, is blanket deposited. The titanium is then reacted with the underlying silicon regions (and selected titanium is removed) to form a self-aligned titanium silicide 28 as shown. It should be further noted that any other silicide-forming metal could be used as suited to a given application, such applications being well understood in the art. Typically, a silicide may be formed by reaction of titanium and silicon at 700° C. for 30 minutes in a nitrogen ambient.

Figure 4C:
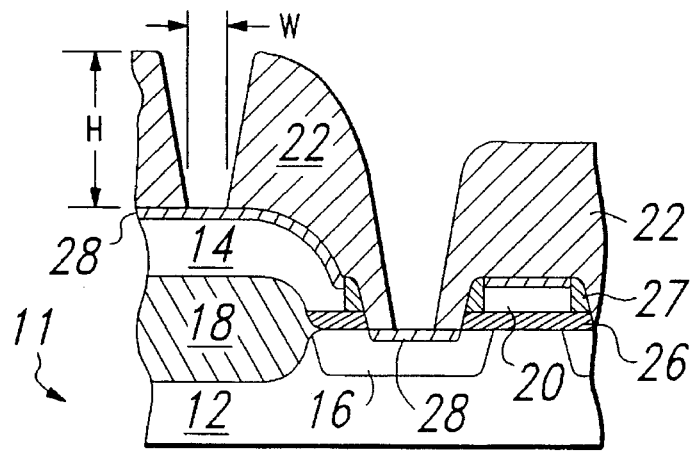

Referring to FIG. 4c, insulator layer 22 is formed and patterned to expose a contact window designated W and a sidewall height H as shown. Insulating layer 22 can be any of a number of combinations of insulating material well known in the art. In the preferred embodiment the insulating material is oxide.

Figure 4D:
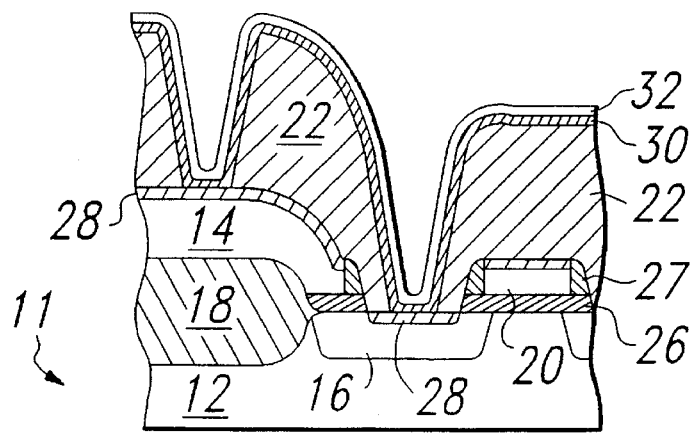

Referring to FIG. 4d, a layer of conductive, substrate-reactive material 30 is formed. In the preferred embodiment, substrate-reactive material 30 is titanium. However, materials other than titanium which are reactive with a given underlying substrate could also be used. In the preferred embodiment, the reacted material (discussed below) is a silicide but the invention is not limited to this. Then a layer of semiconductor material 32, such as noncrystalline silicon, is formed. In the preferred embodiment, the semiconductor material 32 is a noncrystalline silicon layer, however a semiconductor material other than silicon could be used, and indeed if a nonsilicon substrate were used, a nonsilicon semiconductor might be more appropriate. Silicon layer 32 is formed to a thickness in a range of about 500–2,500 Å. Titanium layer 30 and noncrystalline silicon layer 32 may then be patterned and etched to form discrete conductive elements (not shown).

Figure 4E:
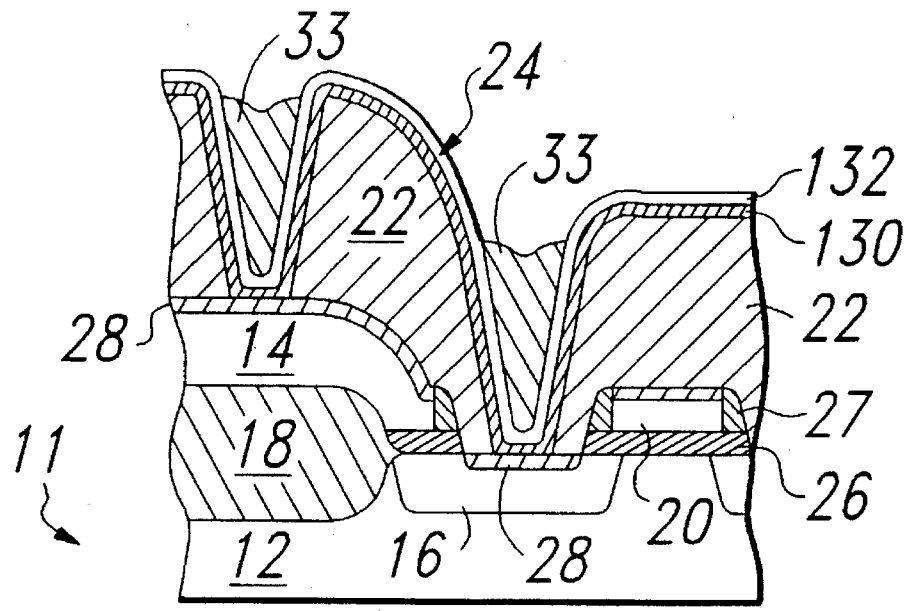

Referring to FIG. 4e, second titanium layer 30 is reacted with noncrystalline silicon layer 32 to form strap 24 which includes a reacted sublayer or titanium silicide layer 130 and noncrystalline silicon sublayer 132. In the course of the reaction a certain proportion of the noncrystalline silicon from noncrystalline silicon layer 32 is consumed and thus it will be understood that the original noncrystalline layer 32 has a greater thickness than the resulting noncrystalline sublayer 132. It should also be noted that although the second titanium layer 30 is graphically depicted in substantially the same manner as titanium silicide sublayer 130, the two are chemically and electrically quite different.

Still referring to FIG. 4e, an insulating layer 33 is then formed to act as a barrier to any subsequent doping steps. The silicon sublayer 132 can then be blanket doped, if desired, to electrically connect the top surface of silicon sublayer 132 and reacted silicide 130.

Figure 4F:
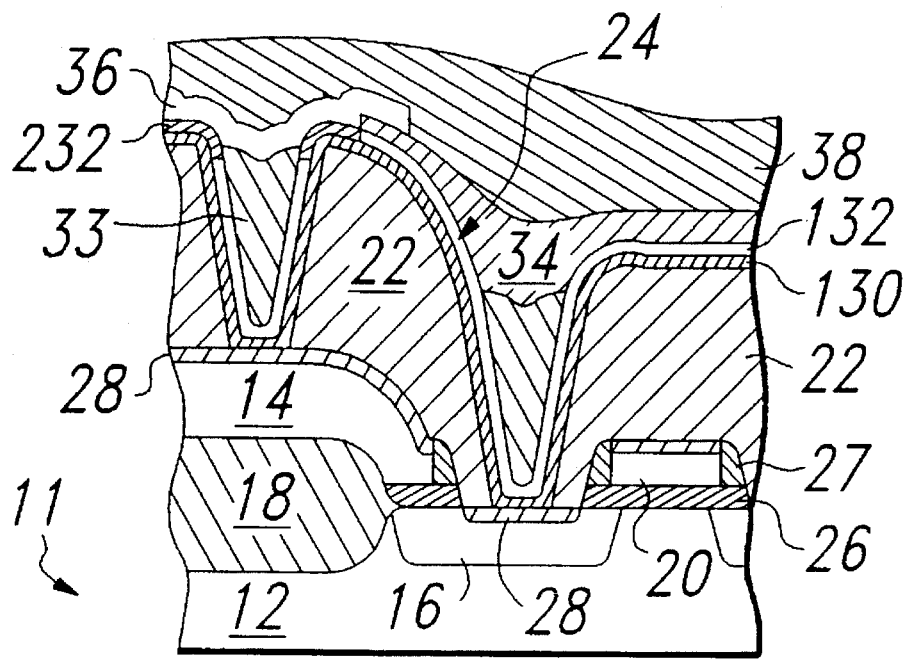

Referring now to FIG. 4f, an insulating layer 34 can then be formed and patterned as required for other portions of device 11. Then region 132 can be implant doped using layer 34 as a partial mask to form an electrically connected area 232. A layer of conductor or semiconductor material 36, preferably noncrystalline silicon, may then be formed and patterned as shown. Layer 36 may be connected to underlying circuit elements 14 or 16 through doped area 232 and titanium silicide layer 130, as shown. Silicon layer 36 may be selectively doped according to the application, as is well understood in the art. Still referring to FIG. 4f, overlying insulator 38 is then formed over the resulting structure to complete microelectronic device 11. It should be noted that other aspects of device have not been shown which would require other steps well understood in the art such as formation of bonding pads, etc.

The benefits of the present invention will now be discussed with reference to FIG. 4f. In prior art, if doping of layers overlying conductive regions such as gate 14 or moat 16, special care would need be taken to avoid counterdoping of these conductive regions. By using a vertical well structure in conjunction with an oxide 33 as a barrier to dopants, subsequent doping of interlevel connections is allowed directly above the conductive regions without such risks of counterdoping.

Still referring to FIG. 4f, in the prior art, if silicide-reacting metal is to be used simultaneously for silicidation of 15 straps and moats (e.g. metal layer 28 of FIG. 1b is used simultaneously for silicidation for strap 24 and moat 16 of FIG. 1c), the initial thickness of the metal layer is constrained by the sheet-resistivity requirements of the moat. For example about 1000 Å of titanium might be required. On the other hand, according to the present invention, only the titanium layer deposited for purposes of forming titanium silicide layer 28 is constrained by sheet-resistivity requirements for the formation of silicide layer 28 in the formation of moat 16 while titanium layer 30 has no such thickness constraints. In other words, titanium layer 30 may be formed much thinner, e.g. in a range of about 100–300 Å is acceptable in some applications.

With reference to FIG. 4f, because of insulating layer 22, strap 24 can be connected to another conductive site e.g. to the right of unrelated gate 20. In the prior art, no such connection to another conductive site would be possible due to shorting problems associated with unrelated gates, as discussed above. Furthermore, insulating layer 22 also has high etch selectivity relative to titanium (as well as other metals and silicon) and thus etching constraints are considerably eased according to the invention.

Although the invention has been described in detail herein with reference to its preferred embodiments and certain described alternatives, it is to be understood that this description is by way of example only, and is not to be construed in a limiting sense. It is to be further understood that numerous details of the embodiments of the invention, and additional embodiments of the invention will be apparent to, and may be made by persons of ordinary skill in the art having reference to this description. It is contemplated that all such changes and additional embodiments are within the spirit and true scope of the invention as claimed below.

I claim:

1. A connecting structure comprising:
   a substrate;

an insulating layer selectively formed on said substrate, said insulating layer defining an opening over a first region of said substrate wherein said opening has substantially vertical sidewalls of a selected height;

a first interconnective layer formed on said insulating layer and said opening so as to make contact with said first region, said first interconnective layer comprising a top part and a bottom part, the top part being a semiconductor and the bottom part being a conductive material, said first interconnective layer having a thickness sufficient to partially fill said opening and to prevent dopants from subsequent doping operations from penetrating to said first region.

2. The connecting structure of claim 1 and further comprising a masking layer on said first interconnective layer, said masking layer patterned such that selected portions of said top part of said first interconnective layer remain exposed.

3. The connecting structure of claim 2 wherein said masking layer acts as a mask to subsequent doping operations by which the semiconductor of said exposed portions of said top part of said first interconnective layer is doped to render a low resistivity path from said top part to said bottom part of said first interconnective layer.

4. The connecting structure of claim 2 and further comprising a second insulating layer overlying selected portions of said first interconnective layer and said masking layer and patterned such that selected portions of said first interconnective layer remain exposed.

5. The connecting structure of claim 4 and further comprising a second interconnective layer overlying said second insulating layer, and in electrical communication with said first interconnective layer.

6. The connecting structure of claim 1 wherein said first interconnective layer is patterned so as to form a conducting path between said first region and a second region on said substrate.

7. The connecting structure of claim 6 wherein said first region is the drain region of a first transistor and said second region is the gate region of a second transistor.

8. The connecting structure of claim 7 wherein said gate region and said drain region are part of an SRAM cell structure.

9. The connecting structure of claim 6 wherein said first region is a semiconductor of a first impurity type and said second region is a semiconductor of a second impurity type.

10. A connecting structure comprising:

a substrate having a first region and a second region;

a first insulating layer selectively formed on said substrate, said first insulating layer defining first and second openings over said first and second regions, said openings having substantially vertical sidewalls of a selected height;

a first interconnective layer formed over said insulating layer and said opening so as to make contact with said first and second region, said first interconnective layer formed of a silicide-forming metal reacted with an overlying undoped silicon layer, said first interconnective layer patterned so as to define a conducting strap between said first region and a second region;

a masking layer over said first interconnective layer, said masking layer formed to have a second selected height overlying at least said first and second openings, said masking layer patterned such that selected portions of said first interconnective layer remain exposed, said masking layer acting as a mask to subsequent doping operations by which the undoped silicon of said exposed portions are doped to render a low resistivity path to said underlying silicide-forming metal, and said second selected height of said insulating layer being sufficient to prevent dopants from penetrating the portions of said first interconnective layer which lies approximately above said first and second regions whereby counter-doping of said regions may be reduced;

a second interconnective layer overlying said masking layer and said exposed conducting strap;

a second insulating layer overlying selected portions of said conducting strap and said masking layer and patterned such that selected portions of said conducting strap remain exposed; and a second interconnective layer overlying said second insulating layer, and overlying and in electrical communication with said conducting strap.

11. A connecting structure comprising:

a substrate;

an insulating layer selectively formed on said substrate, said insulating layer defining an opening over a first region of said substrate;

a first interconnective layer formed on said insulating layer and in said opening so as to make contact with said first region, said first interconnective layer comprising a top part and a bottom part, the top part being a semiconductor and the bottom part being a conductive material, said first interconnective layer deposited on the sidewalls of said opening such that a cavity is defined by said first interconnective layer within said opening; and an insulating plug partially filling said cavity and overlying said first interconnective layer about the perimeter of said cavity, said insulating plug acting as a mask to subsequent doping operations by which the semiconductor of an exposed portion of said top part is doped to render a low resistivity path from said top part to said bottom part of said first interconnective layer, said plug acting to prevent dopants from said subsequent doping operations from penetrating to said first region.

12. The connecting structure of claim 11 and further comprising a second insulating layer overlying selected portions of said first interconnective layer and said insulating plug and patterned such that selected portions of said first interconnective layer remain exposed.

13. The connecting structure of claim 12 and further comprising a second interconnective layer overlying said second insulating layer, and in electrical communication with said first interconnective layer.

14. The connecting structure of claim 11 wherein said first interconnective layer is patterned so as to form a conducting path between said first region and a second region.

15. The connecting structure of claim 14 wherein said first region is the drain region of a first transistor and said second region is the gate region of a second transistor.

16. The connecting structure of claim 15 wherein said gate region and said drain region are part of an SRAM cell structure.

17. The connecting structure of claim 14 wherein said first region is a semiconductor of a first impurity type and said second region is a semiconductor of a second impurity type.

18. A connecting structure comprising:

a substrate;

an insulating layer selectively formed on said substrate, said insulating layer defining an opening over a first region of said substrate;

a conductive layer formed on said insulating layer and in said opening;

a second insulating layer formed on said conductive layer, said second insulating layer and said conductive layer deposited on the sidewalls of said opening such that a cavity is defined within said second insulating layer;

an insulating plug partially filling said cavity and overlying said first interconnective layer about the perimeter of said cavity, said insulating plug acting as a mask during doping operations to prevent doping of the first region of the substrate; and a conductive region formed in the second insulating layer.

19. The structure of claim 18 wherein said conductive region acts to electrically connect the top surface of said second insulating layer and said conductive layer.

20. The structure of claim 19 and further comprising a third insulating layer formed on said second insulating layer such that portions of said conductive region remain exposed.

21. The structure of claim 19 and further comprising a second conductive layer formed on said second insulating layer and in electrical communication with said conductive region.

* * * * *